United States Patent
Zhou et al.

(10) Patent No.: US 8,194,412 B2
(45) Date of Patent: Jun. 5, 2012

(54) PRINTED CIRCUIT BOARD

(75) Inventors: Hua-Li Zhou, Shenzhen (CN);
Chia-Nan Pai, Taipei Hsien (TW);
Shou-Kuo Hsu, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 333 days.

(21) Appl. No.: 12/647,395

(22) Filed: Dec. 25, 2009

(65) Prior Publication Data

US 2011/0094782 A1    Apr. 28, 2011

(30) Foreign Application Priority Data

Oct. 28, 2009   (CN) .......................... 2009 1 0308935

(51) Int. Cl.
*H05K 1/18* (2006.01)
*H05K 1/16* (2006.01)
*H05K 7/00* (2006.01)

(52) U.S. Cl. ......... 361/763; 174/260; 361/766; 361/782

(58) Field of Classification Search .................. 174/260; 361/760, 761, 763, 766, 782, 794, 807, 811
See application file for complete search history.

(56) References Cited

U.S. PATENT DOCUMENTS

| | | | | |
|---|---|---|---|---|
| 6,043,987 A * | 3/2000 | Goodwin et al. | ............. | 361/763 |
| 6,433,286 B1 * | 8/2002 | Doberenz | ...................... | 174/261 |
| 6,658,732 B2 * | 12/2003 | Doberenz | ........................ | 29/846 |
| 2008/0179724 A1 * | 7/2008 | Gregory | ........................ | 257/676 |
| 2008/0284538 A1 * | 11/2008 | Hsu | ............................... | 333/124 |

* cited by examiner

*Primary Examiner* — Timothy J Thompson
*Assistant Examiner* — Sherman Ng
(74) *Attorney, Agent, or Firm* — Altis Law Group, Inc.

(57) ABSTRACT

A printed circuit board includes a signal plane and a reference plane. The signal plane includes a pad, a passive element mounted on the pad, and a signal transmission line electrically connected to the passive element via the pad. The reference plane provides a return path for a signal transmitted through the passive element and the signal transmission line. A void is defined in the reference plane corresponding to the passive element, to increase a length of the return path. A length of a first axis, perpendicular to the signal transmission line, of the void satisfies a following equation:

$$W_1 \approx \frac{8Wpad + 10T}{0.8Wtrace + T},$$

wherein Wpad is a width of the pad, Wtrace is a width of the transmission line, T is the height of the pad.

5 Claims, 6 Drawing Sheets

PRINTED CIRCUIT BOARD

CROSS-REFERENCE TO RELATED APPLICATION

Relevant subject matter is disclosed in a co-pending U.S. patent application Ser. No. 12/647,396 filed on the same date and having a title of "PRINTED CIRCUIT BOARD", which is assigned to the same assignee as this patent application.

BACKGROUND

1. Technical Field

The present disclosure relates to printed circuit boards (PCBs) and, particularly, to a PCB which can improve signal integrity passing through the PCB.

2. Description of Related Art

In a PCB design process, high-speed serial signal lines are usually electrically connected to passive elements, such as resistors or capacitors, via pads mounted on the PCB.

Referring to FIG. 1, an ordinary PCB includes a signal plane 10 and a reference plane 12 which is an integrated plane without any gap arranged under the signal plane for providing a return path of signals. A passive element, such as a resistor R, and a signal transmission line 14 are arranged on the signal plane, and the resistor R is electrically connected to the signal transmission line 14 via a pad 18. A signal transmitted through the resistor R and the signal transmission line 14 will be returned in the reference plane 12 and under the signal transmission line 14 (see a return path 16). Because a width of the pad 18 is greater than a width of the signal transmission line 14, characteristic impedance changes sharply from the transmission line 14 to the pad 18, which may influence signal integrity.

FIG. 2 shows a graph of the characteristic impedance from the transmission line 14 to the pad 18 when the resistor R is a 0402 size specification, and Wpad=20 mils, Spad=54 mils, Wtrace=5 mils. Wherein Wpad is a width of the pad 18, Spad is a length of the pad 18, Wtrace is a width of the signal transmission line 14. Obviously, the signal integrity of the PCB 10 is poor.

DETAILED DESCRIPTION

Figure 3:
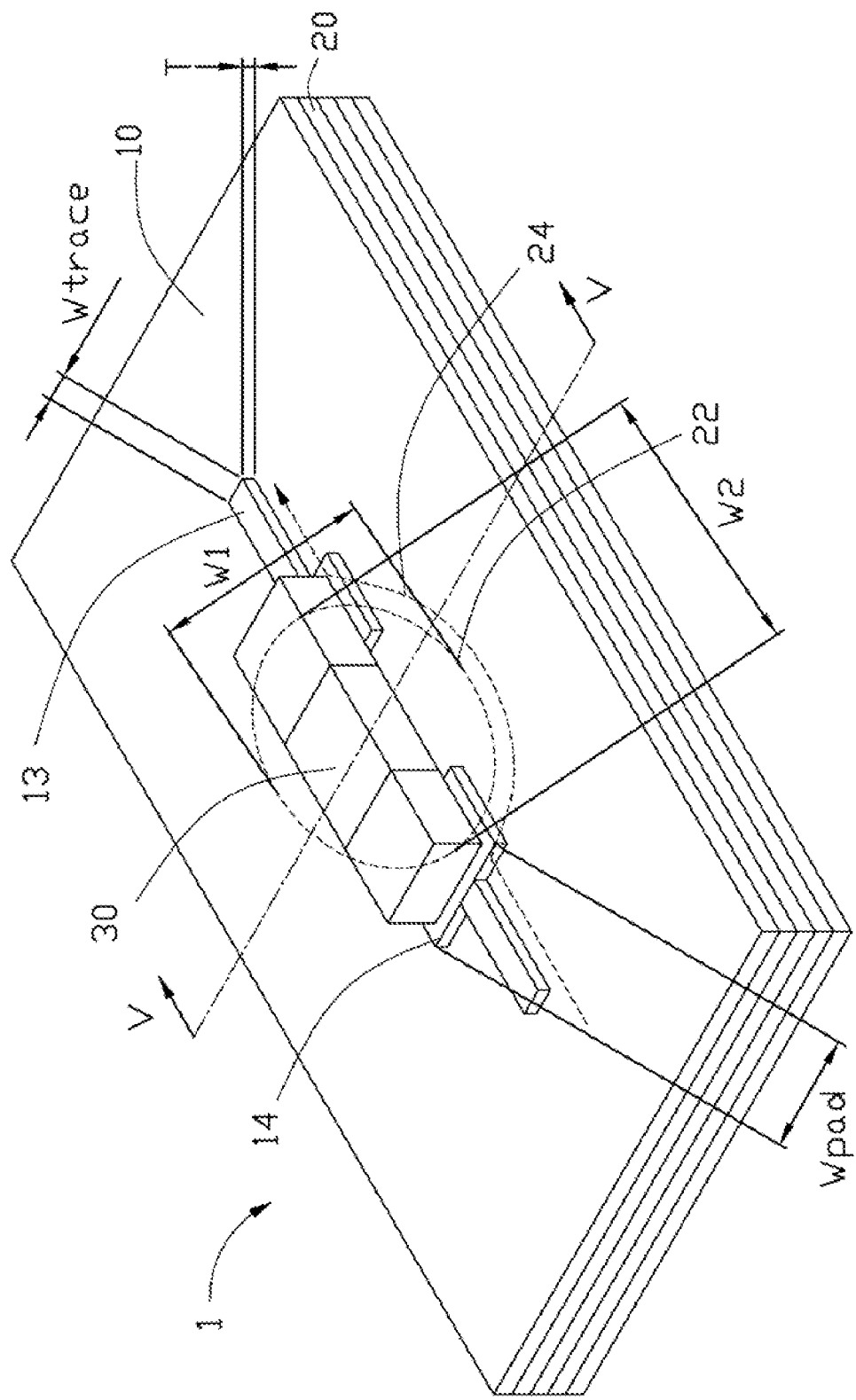
FIG. 3 is a schematic view of an exemplary embodiment of a PCB, including a reference plane, a passive element, and a signal transmission line arranged on a signal plane, the passive element electrically connected to the signal transmission line via a pad.

Referring to FIG. 3, an exemplary embodiment of a printed circuit board (PCB) 1 includes a signal plane 10 and a reference plane 20. It may be understood that the PCB 1 also includes other planes, such as a power plane. These other planes fall within well-known technologies, and are therefore not described here.

The signal plane 10 includes a pad 14 for mounting a passive element 30, such as a resistor or a capacitor. A signal transmission line 13 is mounted on the signal plane 10 and electrically connected to the passive element 30 via the pad 14. The reference plane 20 is used to provide a return path of signals, such as high-speed serial signals, transmitted through the signal transmission line 13 and the passive element 30.

Figure 4:
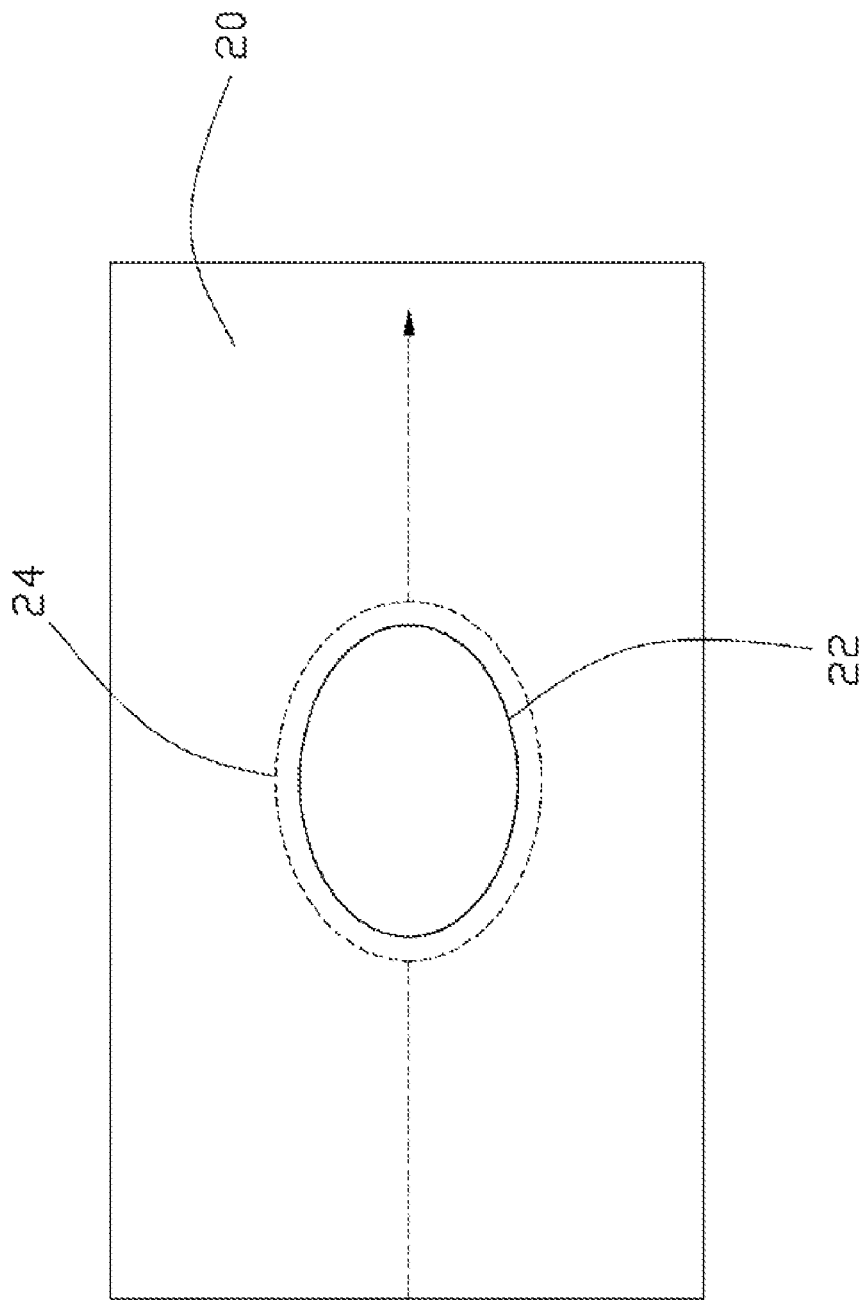
FIG. 4 is a schematic view of the reference plane of the PCB of FIG. 5.
Figure 5:
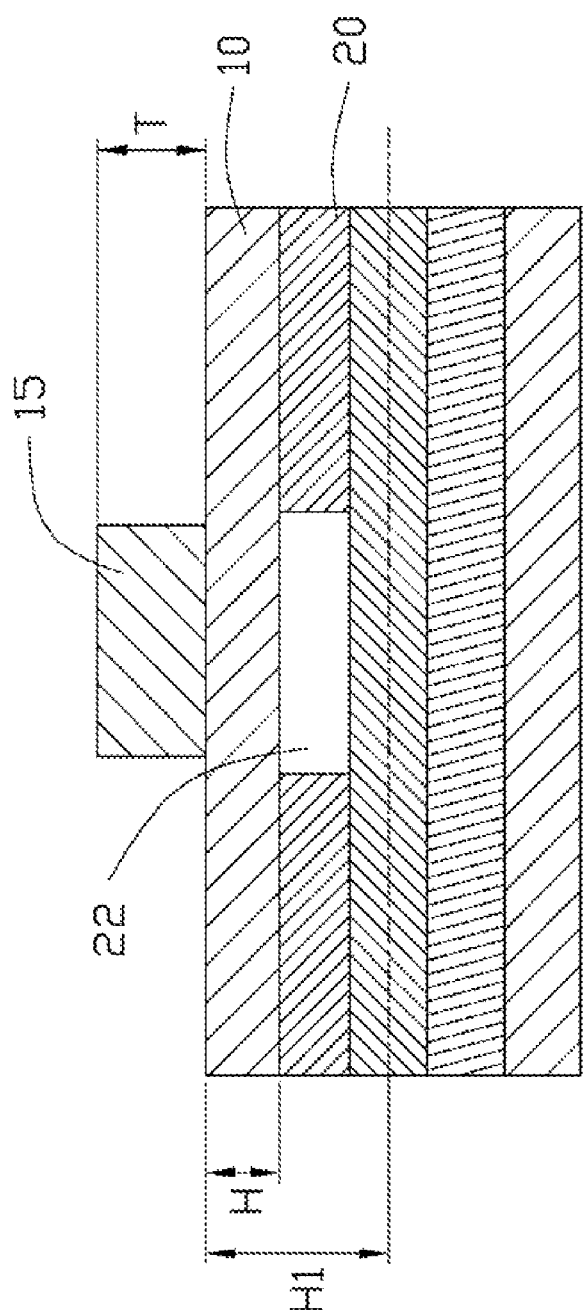
FIG. 5 is a cross-sectional view of the PCB of FIG. 3, taken along line V-V.

Referring to FIGS. 4 and 5, the reference plane 20 defines an elliptic-shaped void 22 corresponding to the passive element 30. A center of the void 22 corresponds to a center of the passive element 30. In other embodiments, the shape of the void 22 can be round, and so on. An outline of the void 22 needs to be a smooth curve to avoid generating reflections. Because a portion under the passive element 30 of the reference plane 20 is a void 22, a signal transmitted through the passive element 30 and the signal transmission line 13 will be returned in the reference plane 20 and rounds the void 22 (see a return path 24), therefore the return path 24 is greater, a characteristic impedance from the signal transmission line 13 to the pad 14 does not undergo mutation, which can improve signal integrity.

To improve signal integrity, the impedance of the signal transmission line 13 substantially matches with the impedance of the pad 14. According to a formula for calculating an impedance of transmission line:

$$Z = \frac{87}{\sqrt{\varepsilon_r + 1.41}} \ln \frac{5.98H}{0.8W + T},$$

an equation Zpad=Ztrace needs to be satisfied to improve signal integrity, namely $$\frac{87}{\sqrt{\varepsilon_r + 1.41}} \ln \frac{5.98H_1}{0.8Wpad + T} = \frac{87}{\sqrt{\varepsilon_r + 1.41}} \ln \frac{5.98H}{0.8Wtrace + T},$$

also namely $$\frac{H_1}{0.8Wpad + T} = \frac{H}{0.8Wtrace + T}.$$

Wherein, Zpad is the impedance of the pad 14, Ztrace is the impedance of the transmission line 14, H1 is a distance between the a bottom of the pad 14 and a reference plane perpendicularly below the void 22, H is a height of the signal plane 10, T is a height of the pad 14, Wpad is a width of the pad 14, Wtrace is a width of the transmission line 13. An equation $$\frac{kW_1 H}{0.8Wpad + T} = \frac{H}{0.8Wtrace + T}$$

is obtained via setting $H_1 = kW_1 H$. Wherein k is a coefficient, $W_1$ is a length of a minor axis of the void 122. $k \approx 0.1$ is obtained via simulation. Therefore, $$W_1 \approx \frac{8Wpad + 10T}{0.8Wtrace + T}.$$

Because $W_2=qW_1$, $q=0.5$~$2.5$ can be obtained via simulation. Wherein $W_2$ is a length of a major axis of the void 122. Therefore, the outline of the void 22 can be ascertained via the length of the minor axis and the major axis of the void 22.

Figure 1:
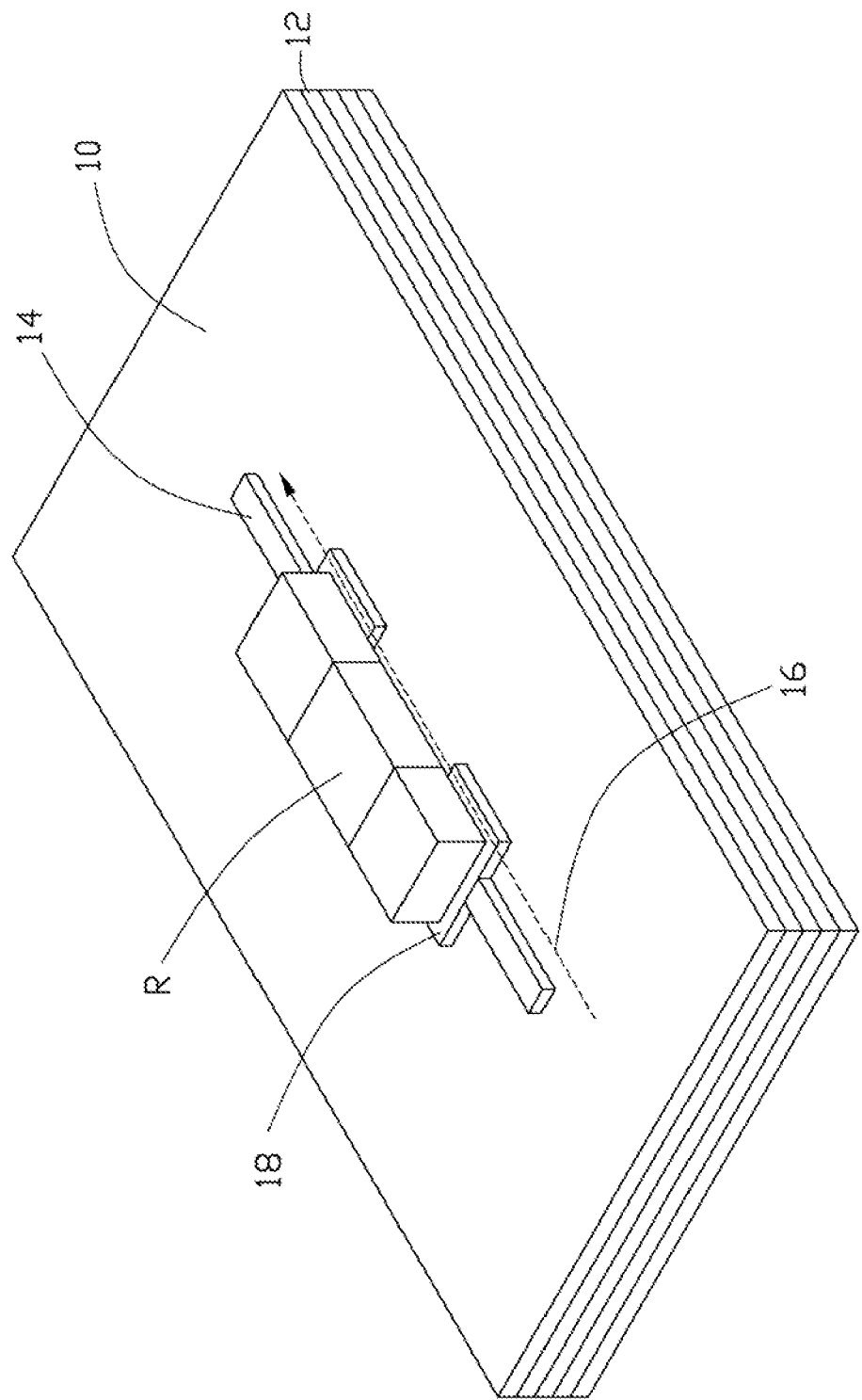
FIG. 1 is a schematic view of a related-art printed circuit board (PCB), including a resistor, a signal transmission line arranged on a signal plane, the resistor electrically connected to the signal transmission line via a pad.
Figure 2:
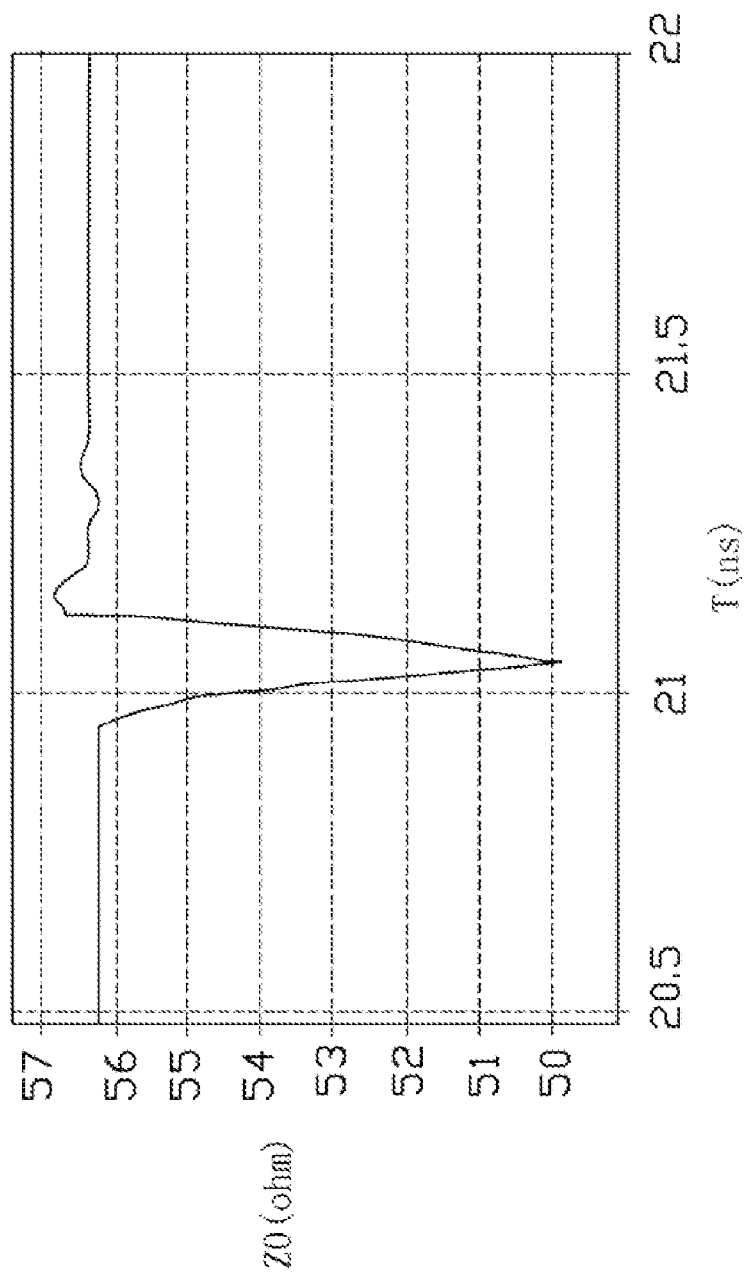
FIG. 2 is a graph of the characteristic impedance from the transmission line to the pad of the related-art PCB of FIG. 1, in response to the resistor being 0402 size.
Figure 6:
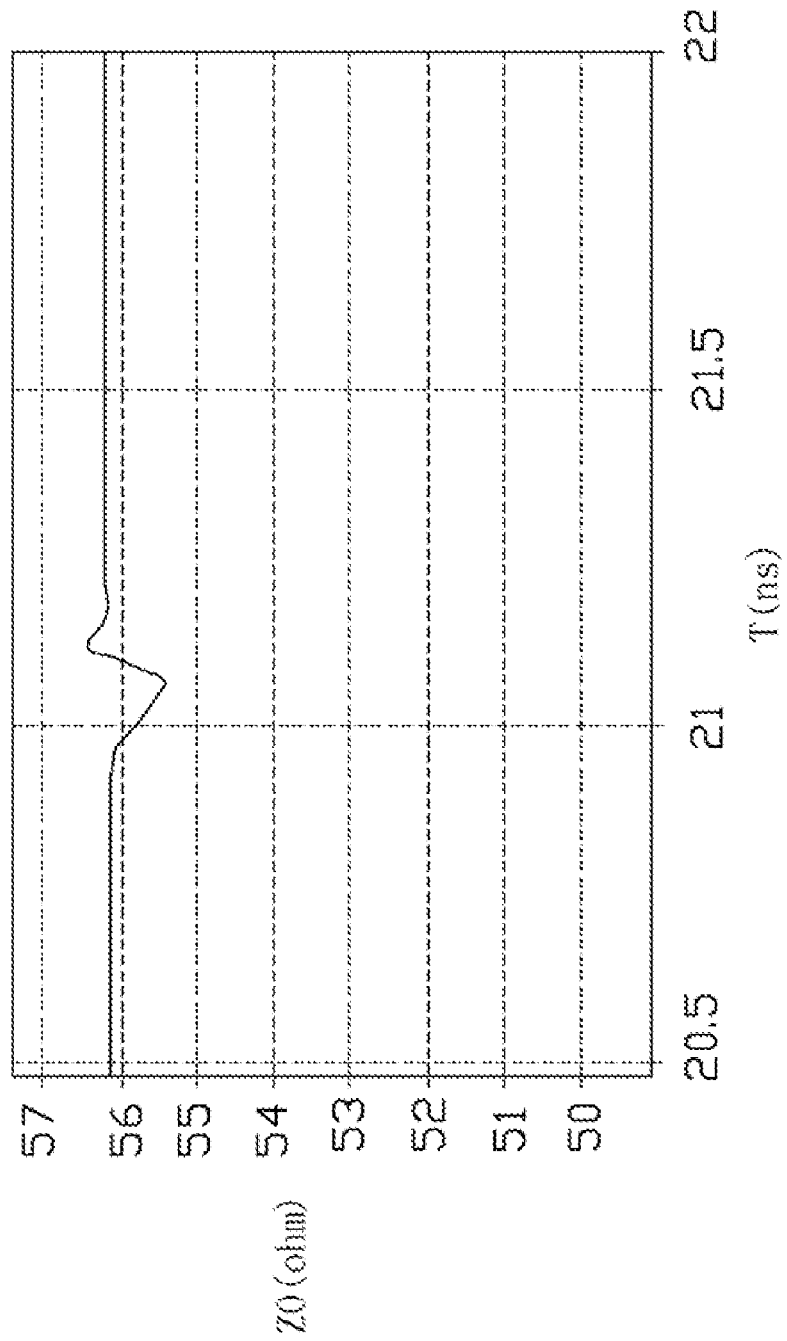
FIG. 6 is a graph of the characteristic impedance from the transmission line to the pad of the PCB of FIG. 3, in response to the passive element being 0402 size.

Referring to FIG. 6, it shows a graph of the characteristic impedance from the transmission line 13 to the pad 14 when the resistor is a 0402 size specification, and Wpad=20 mils, Wtrace=5 mils, $W_1$=30 mils, $W_2$=51 mils. Obviously, comparing to the FIG. 2, the signal integrity of the PCB 1 is better than the signal integrity of the PCB 10.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board (PCB) comprising:
   a signal plane comprising a pad, a passive element mounted on the pad, and a signal transmission line electrically connected to the passive element via the pad; and
   a reference plane to provide a return path for a signal transmitted through the passive element and the signal transmission line, wherein a void is defined in the reference plane corresponding to the passive element, to increase a length of the return path, a length of a first axis, perpendicular to the signal transmission line, of the void satisfies a following equation:

$$W_1 \approx \frac{8Wpad + 10T}{0.8Wtrace + T},$$

wherein Wpad is a width of the pad, Wtrace is a width of the signal transmission line, T is the height of the pad.

2. The PCB of claim 1, wherein a length of a second axis, perpendicular to the first axis, of the void satisfies a following equation: $W_2=qW_1$, wherein $q=0.5$~$2.5$.

3. The PCB of claim 2, wherein the void is elliptic-shaped, the first axis is a minor axis of the void, the second axis is a major axis of the void, a center of the void corresponds to a center of the passive element.

4. The PCB of claim 1, wherein the passive element is a resistor or a capacitor.

5. The PCB of claim 1, wherein the signal transmission line is a high-speed serial signal trace, to transmit high-speed serial signals.

* * * * *